(12) United States Patent  
Morimoto

(10) Patent No.: US 8,643,345 B2  
(45) Date of Patent: Feb. 4, 2014

(54) COMBINED SEMICONDUCTOR RECTIFYING DEVICE AND THE ELECTRIC POWER CONVERTER USING THE SAME

(75) Inventor: Tetsuhiro Morimoto, Azumino (JP)

(73) Assignee: Fuji Electric Co., Ltd. (JP)

( * ) Notice: Subject to any disclaimer, the term of this patent is extended or adjusted under 35 U.S.C. 154(b) by 473 days.

(21) Appl. No.: 12/718,488

(22) Filed: Mar. 5, 2010

(65) Prior Publication Data

US 2010/0253312 A1 Oct. 7, 2010

(30) Foreign Application Priority Data

Mar. 31, 2009 (JP) ................................. 2009-083903

(51) Int. Cl.
*G05F 1/70* (2006.01)
*H01L 29/872* (2006.01)

(52) U.S. Cl.
USPC .......................... 323/207; 323/282; 257/476

(58) Field of Classification Search
USPC .......... 323/207, 222, 282; 257/472, 476, 485, 257/E27.051, E29.338
See application file for complete search history.

(56) References Cited

U.S. PATENT DOCUMENTS

| | | | |
|---|---|---|---|
| 4,679,251 A * | 7/1987 | Chown ........................ | 398/202 |
| 5,136,187 A * | 8/1992 | Ceccherelli et al. ............ | 326/30 |
| 6,852,580 B2 * | 2/2005 | Yanagihara et al. .......... | 438/170 |
| 6,906,503 B2 * | 6/2005 | Lopez-Santillana et al. . | 323/283 |
| 6,992,385 B2 * | 1/2006 | Satou et al. .................... | 257/735 |
| 7,276,883 B2 * | 10/2007 | Soldano ........................ | 323/222 |
| 2003/0035259 A1 * | 2/2003 | Mauder et al. ............... | 361/93.1 |
| 2003/0085416 A1 * | 5/2003 | Brogle et al. .................. | 257/275 |
| 2006/0255423 A1 * | 11/2006 | Ryu et al. ....................... | 257/485 |
| 2008/0191216 A1 | 8/2008 | Machida et al. | |
| 2008/0258252 A1 * | 10/2008 | Shimizu et al. ............... | 257/476 |
| 2010/0320557 A1 * | 12/2010 | Miyoshi et al. ............... | 257/476 |

FOREIGN PATENT DOCUMENTS

| | | | |
|---|---|---|---|
| JP | 62-277562 | A | 12/1987 |
| JP | 2001-245479 | A | 7/2001 |
| JP | 2004-214268 | A | 7/2004 |
| JP | 2005-276979 | A | 10/2005 |
| JP | 2006-318956 | A | 11/2006 |
| JP | 2007-189792 | A | 7/2007 |
| JP | 2007-250720 | A | 9/2007 |
| JP | 2007-305609 | A | 11/2007 |
| JP | 2008-166639 | A | 7/2008 |
| JP | 2008-198735 | A | 8/2008 |
| JP | 2008-271207 | A | 11/2008 |
| JP | 2009-032769 | A | 2/2009 |

OTHER PUBLICATIONS

J. A. Cooper, Jr., "Unipolar and Bipolar Power Devices in SiC", Purdue University, vol. 11 No. 2 (2000). Eng. abst. provided.

(Continued)

*Primary Examiner* — Adolf Berhane
*Assistant Examiner* — Fred E Finch, III
(74) *Attorney, Agent, or Firm* — Rossi, Kimms & McDowell LLP

(57) ABSTRACT

A combined semiconductor rectifying device includes PN-junction silicon diode and Schottky barrier diode exhibiting a breakdown voltage higher than the breakdown voltage of PN-junction silicon diode, and Schottky barrier diode is made of a semiconductor, the band gap thereof is wider than the band gap of silicon. The combined semiconductor rectifying device exhibits a shortened reverse recovery time, low reverse leakage current characteristics and a high breakdown voltage, and is used advantageously in an electric power converter.

8 Claims, 13 Drawing Sheets

(56) References Cited

OTHER PUBLICATIONS

Japanese office action issued in corresponding Japanese application JP2009-083903, dated Mar. 19, 2013.

Japanese Office Action cited in Japanese counterpart application No. JP2009-083903, dated Sep. 3, 2013 Partial English translation provided.

* cited by examiner

FIG. 11
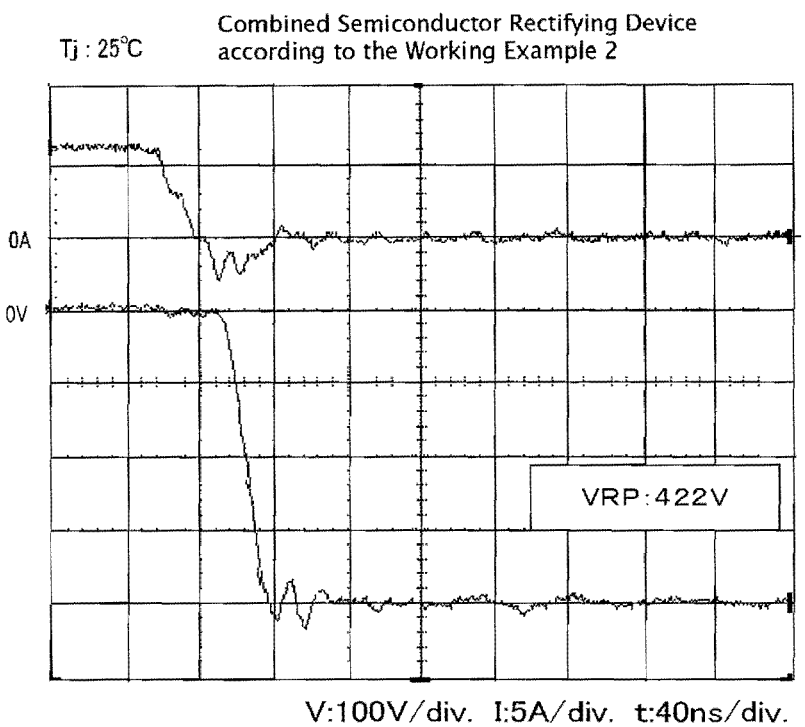
Tj : 25°C    Combined Semiconductor Rectifying Device according to the Working Example 2
VRP:422V
V:100V/div.  I:5A/div.  t:40ns/div.
FIG. 12    Combined Semiconductor Rectifying Device
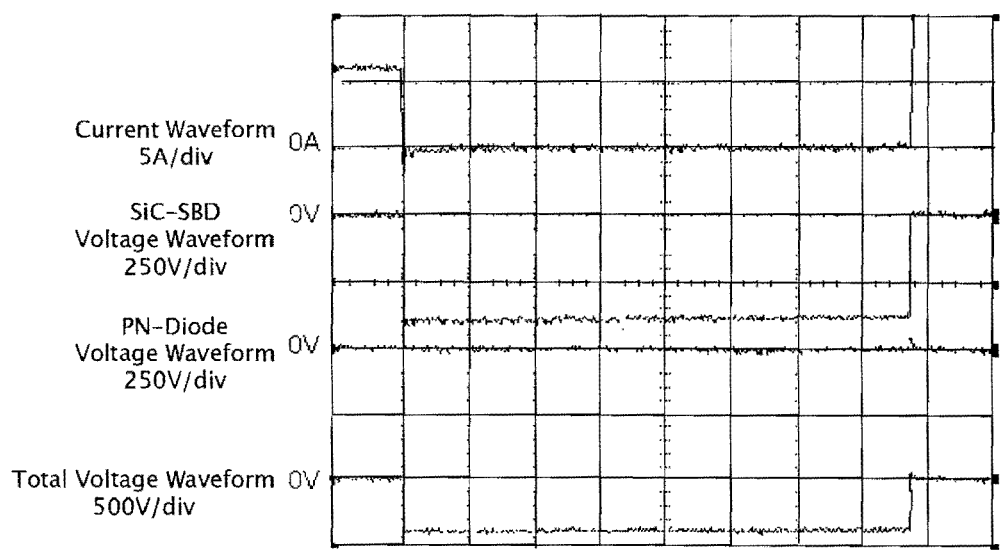
Current Waveform 5A/div
SiC-SBD Voltage Waveform 250V/div
PN-Diode Voltage Waveform 250V/div
Total Voltage Waveform 500V/div

COMBINED SEMICONDUCTOR RECTIFYING DEVICE AND THE ELECTRIC POWER CONVERTER USING THE SAME

BACKGROUND

The present invention relates to a combined semiconductor rectifying device. Specifically, the present invention relates to a combined semiconductor rectifying device that includes a wide-band-gap semiconductor rectifying device (hereinafter referred to as a "WBG semiconductor rectifying device") including a drift region made of a wide-band-gap semiconductor (hereinafter referred to as a "WBG semiconductor"), the band gap thereof is wider than the band gap of silicon, and a silicon semiconductor rectifying device connected in series to the WBG semiconductor rectifying device. The invention relates also to an electric power converter that employs the combined semiconductor rectifying device described above.

In inverter circuits and switching power supply circuits, a switching device is turned on and off at a high frequency. In those circuits, a semiconductor rectifying device (diode) connected in opposite parallel to the switching device and working for a freewheeling diode (hereinafter referred to as an "FWD") also conducts a high-speed switching operation. It is required especially for the semiconductor rectifying device that conducts the high-speed switching operation to exhibit a breakdown voltage as high as the breakdown voltage of the switching device and a reverse recovery time (designated as "trr") as short as the reverse recovery time of the switching device. It is also required for the semiconductor rectifying device to cause a low reverse leakage current IR and a low forward voltage VF.

The reverse recovery time trr of an ordinary PN-junction silicon diode of the 600 V breakdown voltage class is relatively long at the ordinary temperature and long at high temperatures. Due to the long reverse recovery time trr, it is not advantageous to use the PN-junction silicon diode for the FWD described above. However, the PN-junction silicon diode is advantageous due to the reverse leakage current IR thereof smaller than the reverse leakage current IR caused in the wide-bang-gap Schottky barrier diode (hereinafter refereed to as a "WBG-SBD").

In the field of power semiconductor, WBG diodes manufactured using a WBG semiconductor substrate are increasing. Although any product of a high-breakdown-voltage silicon SBD of the 600 V class has not been manufacture yet, the products of WBG-SBDs such as a gallium nitride (GaN) SBD and a silicon carbide (SiC) SBD have been manufactured already. Since these SBDs exhibiting a high breakdown voltage are the devices of a unipolar carrier type, any reverse recovery time trr due to the accumulation of minority carriers is not caused theoretically. Therefore, it is a specific feature of the high-breakdown-voltage SBDs that any variation is not caused in the reverse recovery time trr at high temperatures. However, the reverse leakage current IR of the high-breakdown-voltage SBD higher than the reverse leakage current IR of the PN-junction silicon diode of the same breakdown voltage class is troublesome sometimes.

The circuit configurations that include semiconductor devices, including any of the WBG semiconductor devices described above and connected in series to each other, and the performance improvements of the semiconductor rectifying device based on the series connection structure thereof are described in the following patent documents. Japanese Unexamined Patent Application Publication No. 2005-276979 describes an LED light source having a configuration that connects a GaN LED and Si diodes, connected in series for raising the breakdown voltage, in series in the forward direction. Japanese Unexamined Patent Application Publication No. 2008-198735 describes a combined semiconductor device working for a diode that includes a silicon diode and a unipolar-type control semiconductor device connected in series to each other for improving the reverse recovery time, the breakdown voltage, and the ON-state resistance. Japanese Unexamined Patent Application Publication No. 2004-214268 describes the series connection of a silicon SBD and an SiC diode that facilitates manufacturing a combined diode exhibiting a high breakdown voltage.

Although the combined semiconductor devices described in the above documents employ a series connection of semiconductor devices including a compound semiconductor device, the problems which the combined semiconductor devices intend to solve are different from each other. Any description that suggests the use of the combined semiconductor devices in an inverter circuit or in a switching power supply circuit is not found in the documents. The combined semiconductor device described in the Japanese Unexamined Patent Application Publication No. 2008-198735 is used for a freewheeling diode, and discloses a configuration that makes a series connection of a silicon semiconductor device, exhibiting a low forward voltage drop and a low breakdown voltage, and a control semiconductor device, exhibiting a high breakdown voltage and working equivalently for a resistor in the ON-state thereof, work for a diode. The targets of the combined semiconductor device described in Japanese Unexamined Patent Application Publication No. 2008-198735 are improvements of the forward voltage drop, the breakdown voltage and the reverse recovery time. However, some problems have been left unsolved so far in manufacturing the control semiconductor device using a compound semiconductor economically with low manufacturing costs.

In view of the foregoing, it would be desirable to obviate the problems described above. It would be also desirable to provide a high-breakdown-voltage combined semiconductor rectifying device that exhibits a shortened reverse recovery time and low reverse leakage current characteristics. It would be further desirable to provide an electric power converter that employs the combined semiconductor rectifying device that exhibits the improved performances as described above.

SUMMARY OF THE INVENTION

According to the invention, there is provided a combined semiconductor rectifying device including: a PN-junction silicon diode and a Schottky barrier diode connected in series to each other; the Schottky barrier diode exhibiting a breakdown voltage equal to or higher than the breakdown voltage of the PN-junction silicon diode; and the Schottky barrier diode employing a semiconductor having a band gap wider than the band gap of silicon.

Advantageously, the semiconductor, the band gap thereof is wider than the band gap of silicon, is a silicon carbide semiconductor or a gallium nitride semiconductor.

Advantageously, the PN-junction silicon diode and the Schottky barrier diode are connected in series to each other in the chip states thereof and sealed with a resin in a package.

According to the invention, there is provided the electric power converter including: a circuit including a switching semiconductor device and an inductor; the circuit exhibiting a power factor correction function; and the circuit further including the combined semiconductor rectifying device described above.

According to the invention, there is provided a combined semiconductor rectifying device that exhibits a shortened reverse recovery time, low reverse leakage current characteristics and a high breakdown voltage. There is also provided an electric power converter that employs advantageously the combined semiconductor rectifying device according to the invention.

BRIEF DESCRIPTIONS OF THE DRAWINGS

The invention will be described with reference to certain preferred embodiments and the accompanying drawings, wherein:

FIG. 11 is a wave chart describing the reverse recovery current waveform and the reverse voltage waveform of a combined semiconductor rectifying device according to a working example 2 of the invention that includes the SiC-SBD described in FIG. 9 and the PN-junction silicon FRD described in FIG. 10, which are connected in series to each other;

FIG. 12 is a wave chart describing the waveforms of the voltages shared by the SiC-SBD and the PN-junction silicon FRD with the timings thereof adjusted to the ON and OFF of the current (6 A) and the voltage (400 V) applied to the combined semiconductor rectifying device according to the working example 2;

Figure 9:
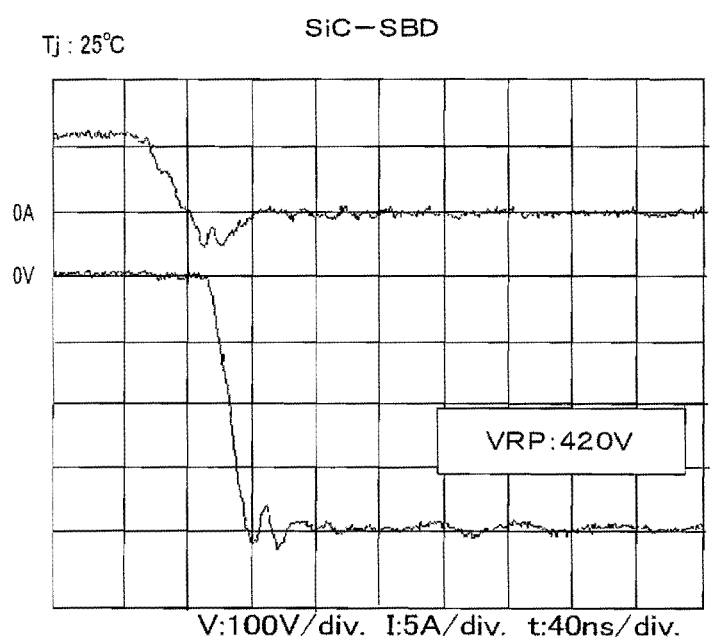
FIG. 9 is a wave chart describing the reverse recovery current waveform and the reverse voltage waveform of an SiC-SBD exhibiting a rated voltage of 600 V and a rated current of 10 A.
Figure 10:
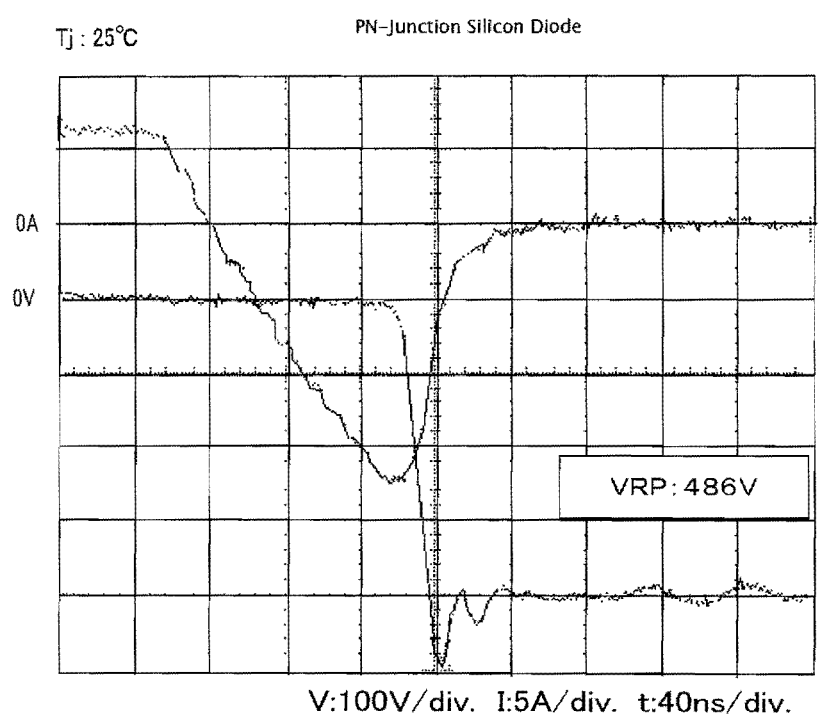
FIG. 10 is a wave chart describing the reverse recovery current waveform and the reverse voltage waveform of a PN-junction silicon FRD exhibiting a rated voltage of 600 V and a rated current of 10 A.
Figure 13:
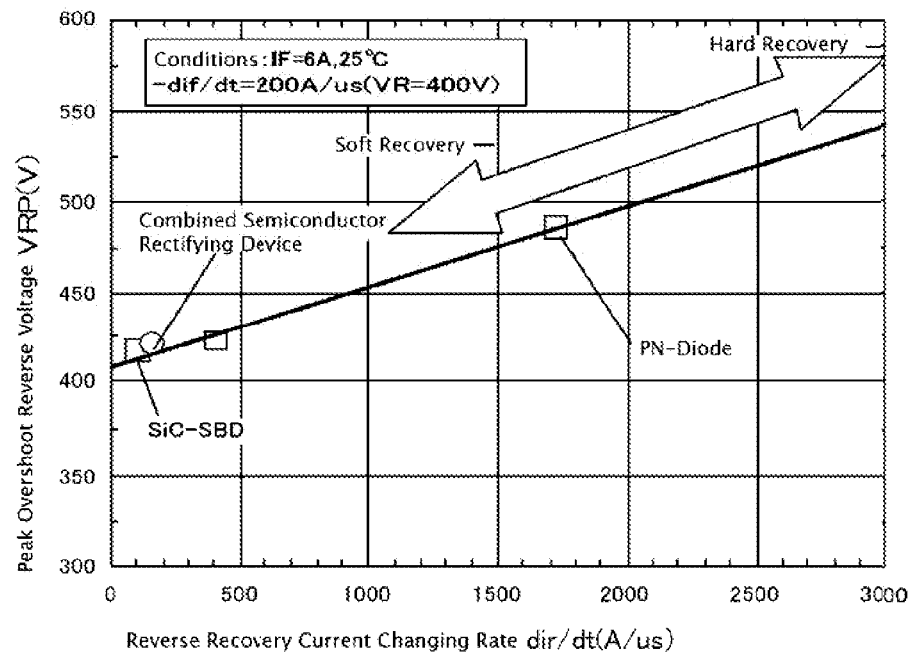
Figure 14:
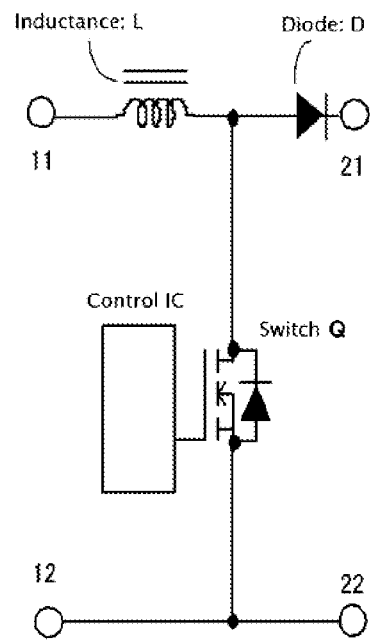
Figure 15:
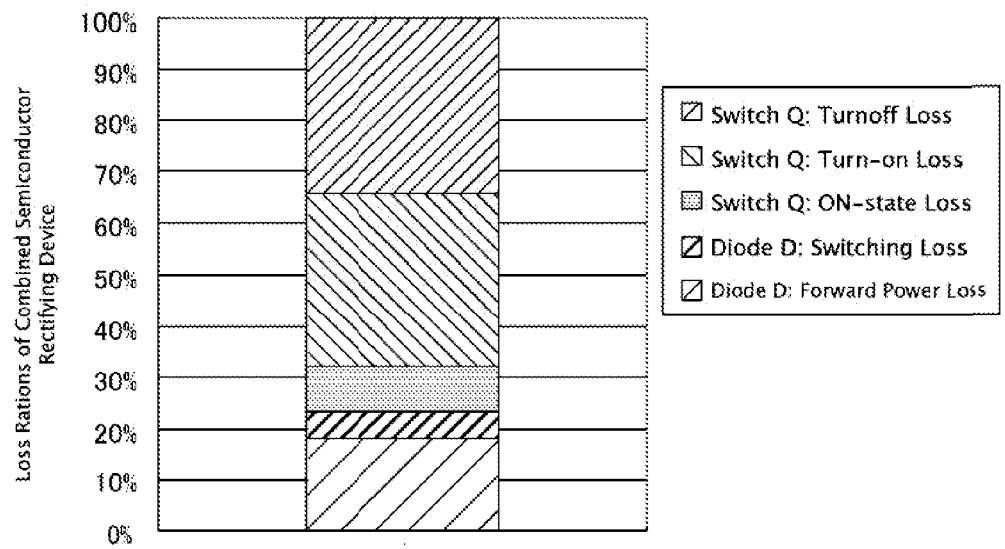
Figure 16:
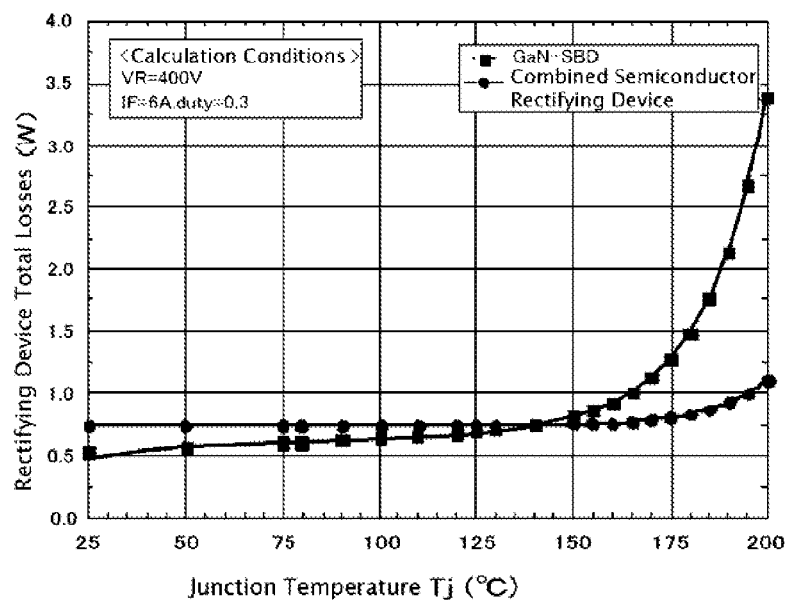
Figure 17:
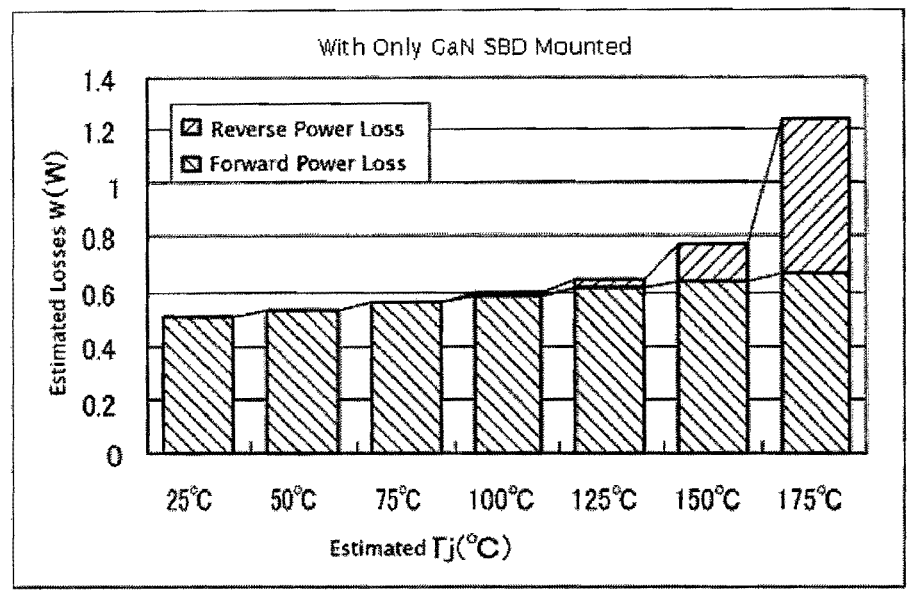
Figure 18:
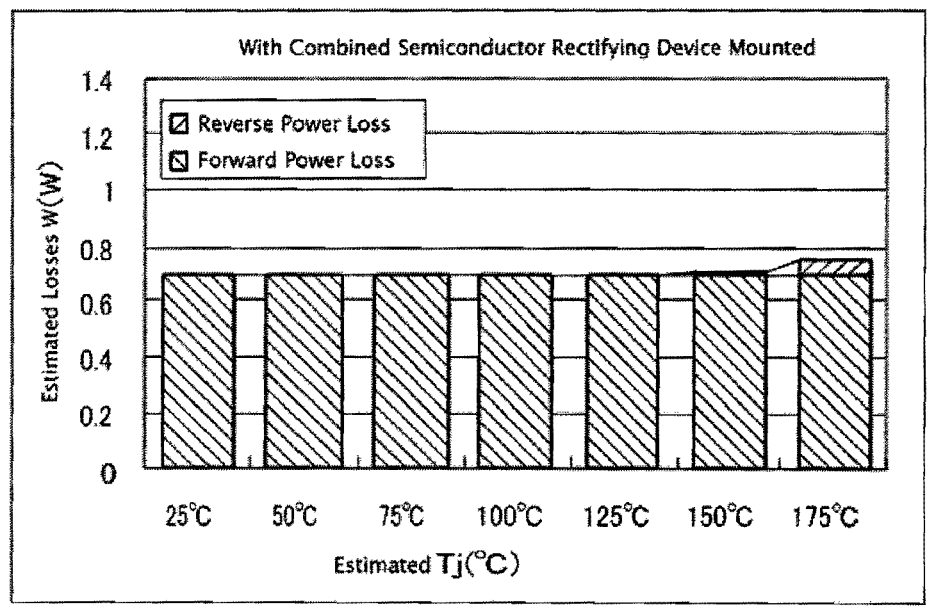

FIG. 13 relates the peak overshoot reverse voltage VRP with the current changing rate dir/dt at the time of reverse recovery based on the reverse recovery current waveforms and the reverse voltage waveforms described in FIGS. 9 through 11;

FIG. 14 is a block circuit diagram showing a boost-type power factor correction ("hereinafter referred to as "PFC") circuit that employs the combined semiconductor rectifying device according to the working example 2 for diode D;

FIG. 15 is a distribution chart describing the estimated loss ratios for diode D and switch Q in the PFC circuit of the continuous current mode, in which the combined semiconductor rectifying device according to the working example 2 is employed for diode D;

FIG. 16 is a pair of curves relating the estimated losses W of the combined semiconductor rectifying device according to the working example 2 used in the PFC circuit of the continuous current mode in a 400 W power supply used for diode D for desktop PCs with the junction temperature Tj;

FIG. 17 is a graph describing the loss contents of the GaN-SBD under the conditions described in FIG. 16; and FIG. 18 is a graph describing the loss contents of the combined semiconductor rectifying device according to the working example 2 under the conditions described in FIG. 16.

DETAILED DESCRIPTION OF THE PREFERRED EMBODIMENTS

Now the invention will be described in detail hereinafter with reference to the accompanied drawings which illustrate the working examples of the invention. Although the invention will be described in connection with the working examples thereof, changes and modifications are obvious to the persons skilled in the art. Therefore, the invention be understood not by the specific descriptions herein but by the appended Claims thereof.

Figure 1:
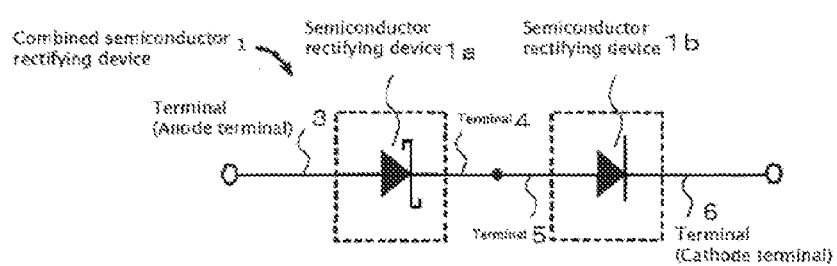
FIG. 1 is an equivalent circuit diagram of a combined semiconductor rectifying device according to an embodiment of the invention.

Referring at first to FIG. 1, semiconductor rectifying device 1a mounts thereon a wide-band-gap Schottky barrier diode (hereinafter referred to as a "WBG-SBD") chip and includes anode terminal 3 and cathode terminal 4. Semiconductor rectifying device 1b mounts thereon a PN-junction silicon diode chip and includes anode terminal 5 and cathode terminal 6. Combined semiconductor rectifying device 1 is assembled by connecting cathode terminal 4 of semiconductor rectifying device 1a and anode terminal 5 of semiconductor rectifying device 1b directly such that semiconductor rectifying devices 1a and 1b are connected in series to each other. Semiconductor rectifying device 1a may be connected in front of semiconductor rectifying device 1b. Alternatively, semiconductor rectifying device 1b may be connected in front of semiconductor rectifying device 1a with no problem. It is desirable for semiconductor rectifying device 1a to be a WBG-SBD that exhibits a breakdown voltage higher than the breakdown voltage of semiconductor rectifying device 1b and a forward voltage drop VF as low as possible. Gallium nitride (GaN) and silicon carbide (SiC) are preferable for the WBG semiconductor, although other compound semiconductors may be employable.

It is also desirable for semiconductor rectifying device 1b to be a PN-junction silicon diode exhibiting a forward voltage drop VF as low as possible. Generally, diodes such as a first recovery diode (hereinafter referred to as an "FRD"), used at a switching frequency of 100 kHz or higher, that causes a lifetime killer diffusion and a power supply diode, used at a switching frequency lower than 100 kHz, that causes no lifetime killer diffusion are used for semiconductor rectifying device 1b. Other diodes may be employable for semiconductor rectifying device 1b. Cathode terminal 4 and anode terminal 5 in FIG. 1 may be connected in any manner as far as an excellent electrical conduction is secured between terminals 4 and 5.

Figure 2:
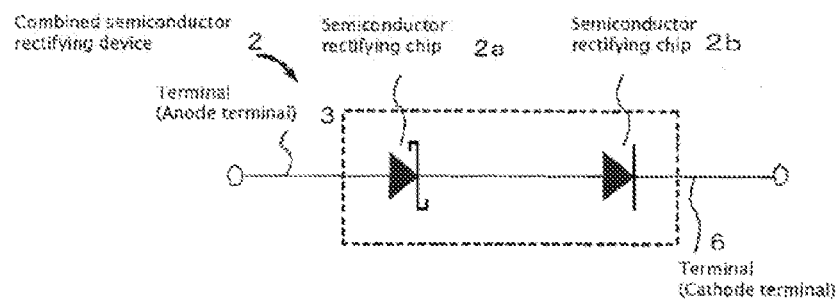
FIG. 2 is an equivalent circuit diagram of a combined semiconductor rectifying device according to another embodiment of the invention.

The circuit shown in FIG. 2 is equivalent to the circuit shown in FIG. 1. In FIG. 1, two diode packages assembled in different locations are connected in series to each other via a metal electrode or a metal terminal. In other words, two discrete diodes are connected in series to each other. FIG. 2 shows combined semiconductor rectifying device 2 that includes semiconductor rectifier chip 2a and semiconductor rectifier chip 2b connected directly in series to each other and sealed with a resin in a package. In FIG. 2, semiconductor rectifier chip 2a is a WBG-SBD chip and semiconductor rectifier chip 2b a PN-junction silicon diode chip. Combined semiconductor rectifying device 2 has a configuration that connects two kinds of diode chips 2a and 2b directly in such an orientation that results in a series connection. Diode chips 2a and 2b are sealed with a sealant region in a package such that anode terminal 3 and cathode terminal 6 led to the outside after the assembly work for external connection terminals.

Now combined semiconductor rectifying device 1 shown in FIG. 1 will be chosen as a representative and the characteristics thereof will be described below in detail.

Working Example 1

Figure 3A:
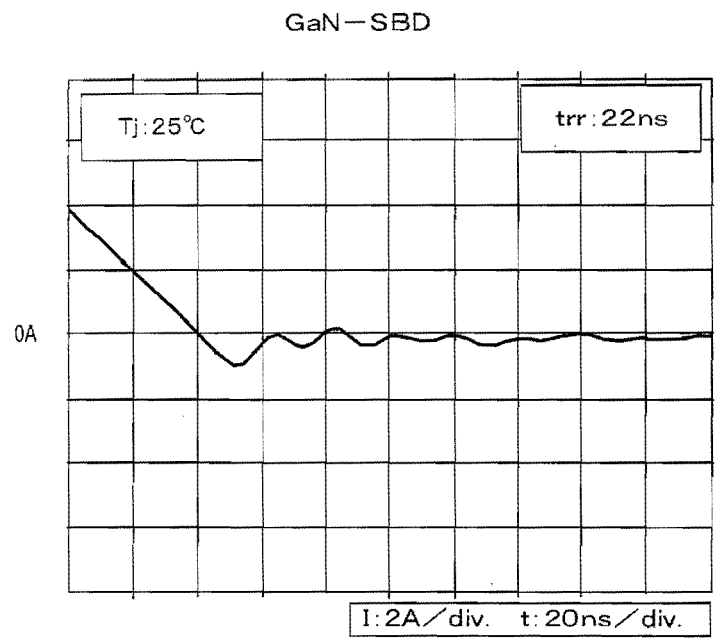
FIG. 3(A) is a wave chart describing the reverse recovery current waveform of a GaN-SBD at the junction temperature Tj of 25° C.
Figure 3B:
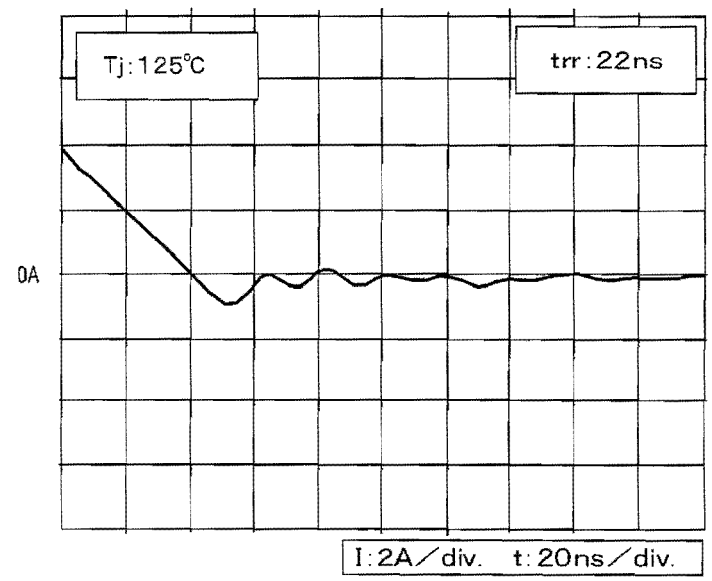
FIG. 3(B) is a wave chart describing the reverse recovery current waveform of the GaN-SBD at the junction temperature Tj of 125° C.
Figure 4A:
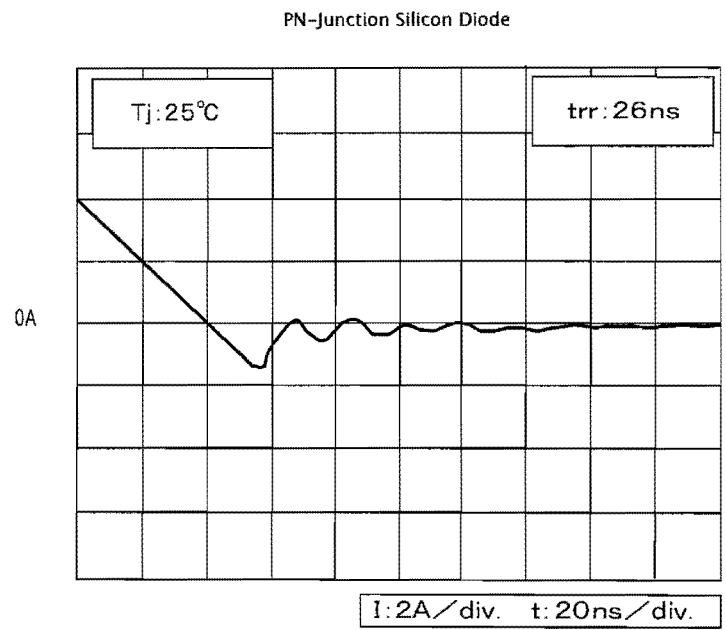
FIG. 4(A) is a wave chart describing the reverse recovery current waveform of a PN-junction silicon fast recovery diode (hereinafter referred to as a "PN-junction silicon FRD") at the junction temperature Tj of 25° C.
Figure 4B:
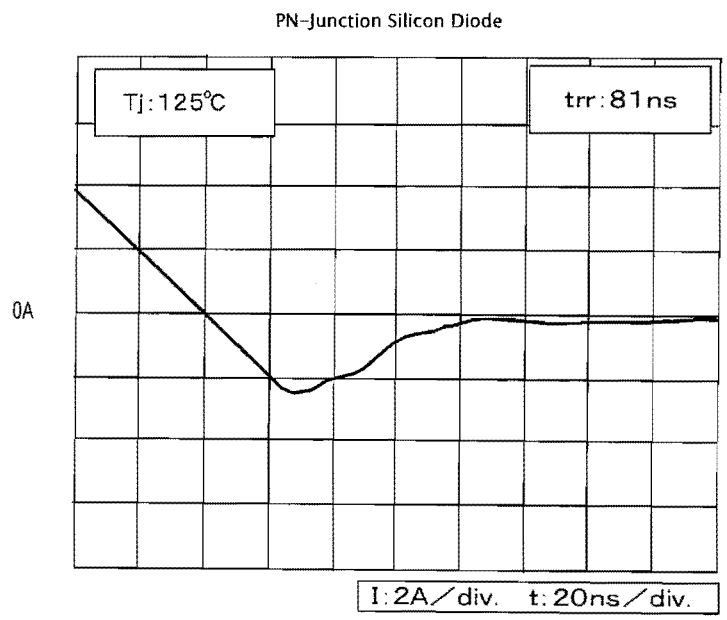
FIG. 4(B) is a wave chart describing the reverse recovery current waveform of the PN-junction silicon FRD at the junction temperature Tj of 125° C.
Figure 5A:
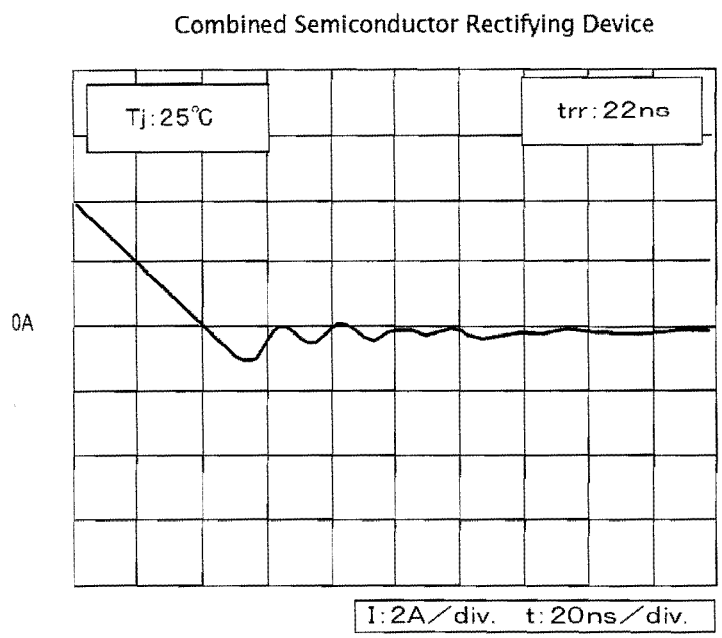
FIG. 5(A) is a wave chart describing the reverse recovery current waveform at the junction temperature Tj of 25° C. of a combined semiconductor rectifying device that includes the GaN-SBD described in FIG. 3(A) and the PN-junction silicon FRD described in FIG. 4(A) which are connected in series to each other.
Figure 5B:
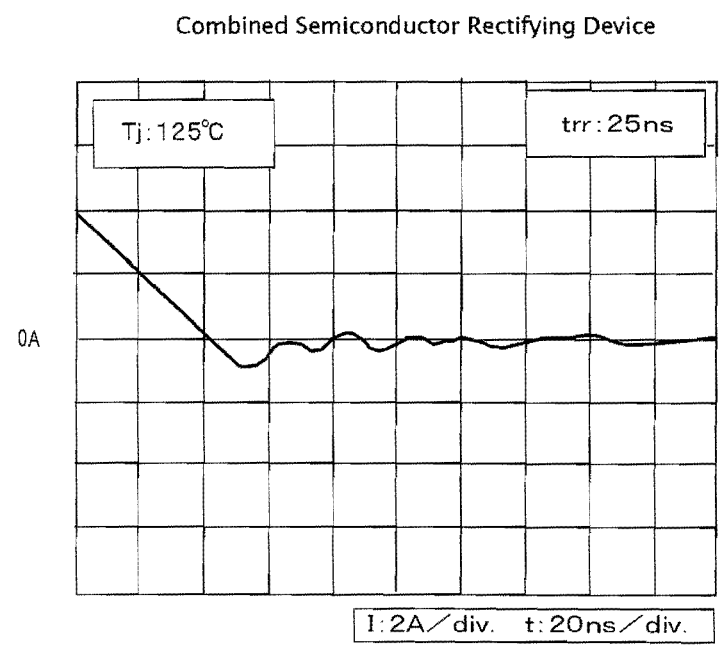
FIG. 5(B) is a wave chart describing the reverse recovery current waveform at the junction temperature Tj of 125° C. of a combined semiconductor rectifying device that includes the GaN-SBD described in FIG. 4(B) and the PN-junction silicon FRD described in FIG. 5(B) which are connected in series to each other.

FIG. 3(A) is a wave chart describing the reverse recovery current waveform of a simple GaN-SBD exhibiting a rated voltage of 600 V and a rated current of 8 A. FIG. 3(B) is another wave chart describing the reverse recovery current waveform of the simple GaN-SBD. FIG. 4(A) is a wave chart describing the reverse recovery current waveform of a simple PN-junction silicon fast recovery diode (hereinafter referred to as "FRD") exhibiting a rated voltage of 600 V and a rated current of 8 A. FIG. 4(B) is another wave chart describing the reverse recovery current waveform of the PN-junction silicon FRD. FIG. 5(A) is a wave chart describing the reverse recovery current waveform of combined semiconductor rectifying device 1 according to the invention that includes the GaN-SBD described in FIG. 3(A) and the PN-junction silicon FRD described in FIG. 4(A) which are connected in series to each other. FIG. 5(B) is another wave chart describing the reverse recovery current waveform of combined semiconductor rectifying device 1 that includes the GaN-SBD described in FIG. 3(B) and the PN-junction silicon FRD described in FIG. 4(B) which are connected in series to each other. In FIGS. 3(A), 4(A) and 5(A), the junction temperature Tj is 25. In FIGS. 3(B), 4(B) and 5(B), the junction temperature Tj is 125° C.

As FIGS. 5(A) and 5(B) indicate, combined semiconductor rectifying device 1 does not exhibit the reverse recovery characteristics of the simple PN-junction silicon FRD but exhibits only the reverse recovery characteristics of the simple GaN-SBD.

Figure 6:
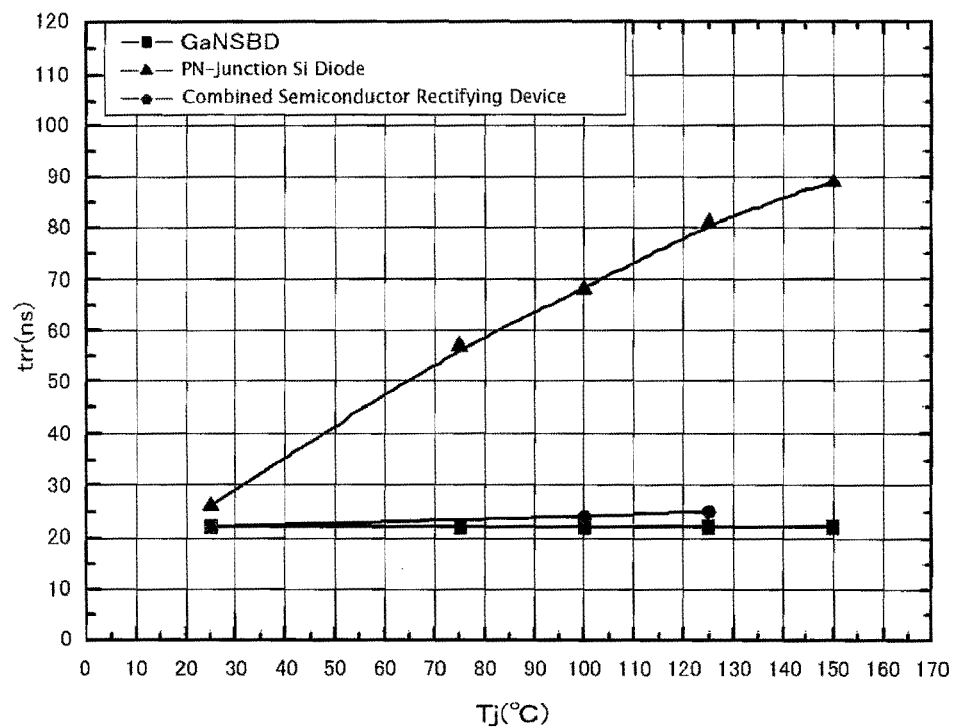
FIG. 6 is a set of curves relating the reverse recovery time trr with the junction temperature Tj for the GaN-SBD, the PN-junction silicon FRD and a combined semiconductor rectifying device according to a working example 1 of the invention.

FIG. 6 is a set of curves relating the reverse recovery time trr with the junction temperature Tj for the GaN-SBD, the PN-junction silicon FRD and combined semiconductor rectifying device 1. As FIG. 6 indicates, combined semiconductor rectifying device 1 exhibits only the reverse recovery characteristics of the simple GaN-SBD.

Figure 7:
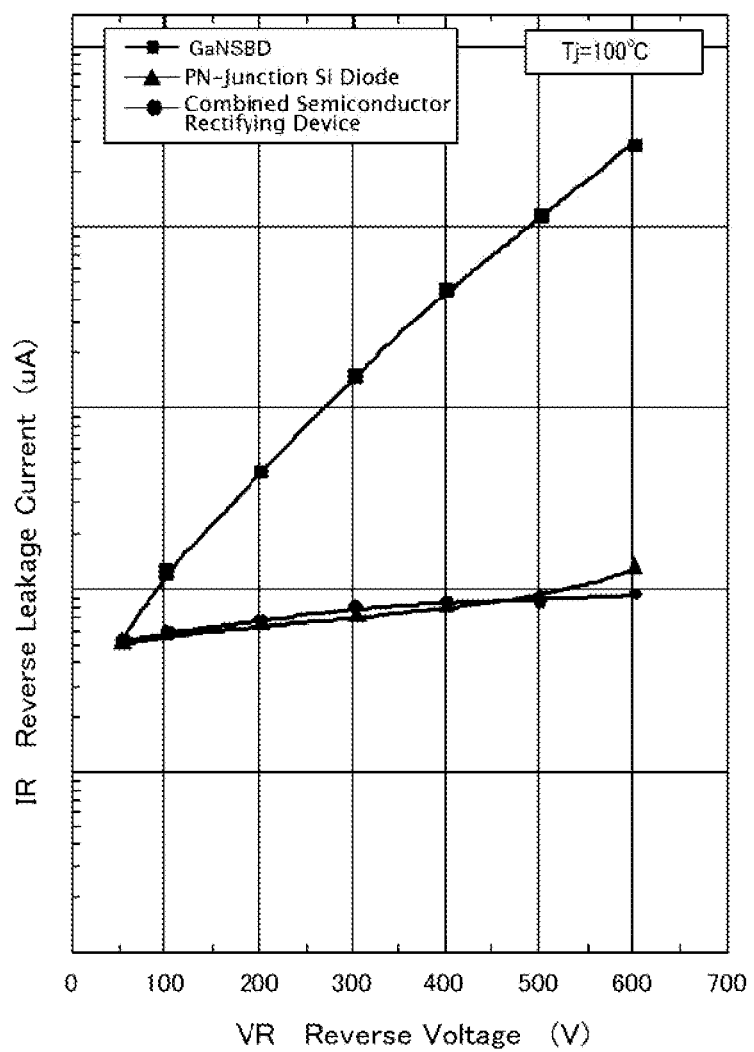
FIG. 7 is a set of curves relating the reverse leakage current IR with the reverse voltage VR for the GaN-SBD, the PN-junction silicon FRD and the combined semiconductor rectifying device according to the working example 1 of the invention.
Figure 8:
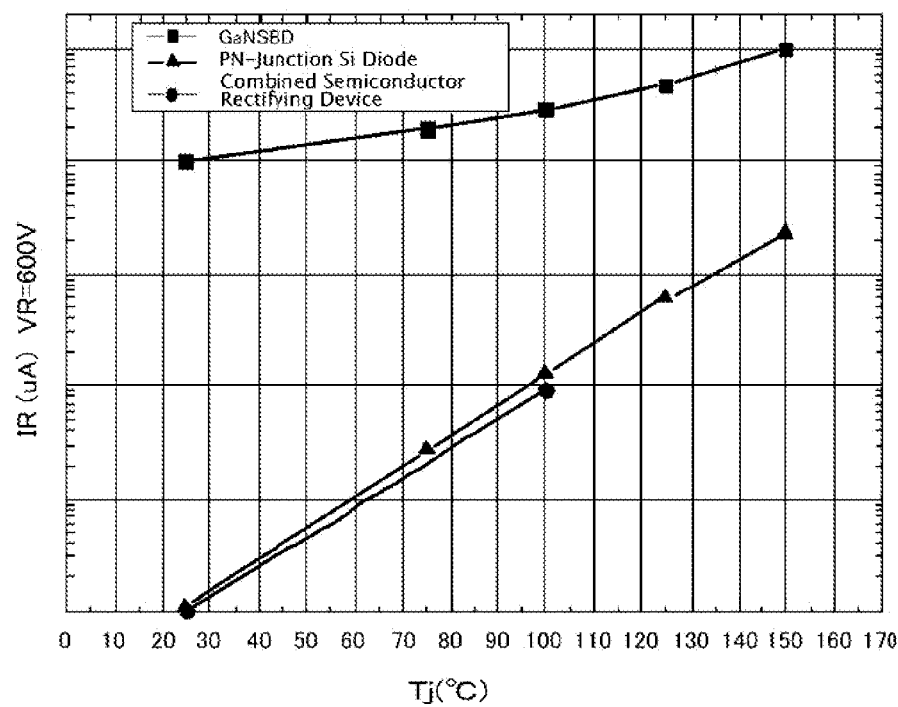
FIG. 8 is a set of curves relating the reverse leakage current IR with the junction temperature Tj for the GaN-SBD, the PN-junction silicon FRD and the combined semiconductor rectifying device according to the working example 1 of the invention.

FIG. 7 is a set of curves relating the reverse leakage current IR with the reverse voltage VR for the GaN-SBD, the PN-junction silicon FRD and combined semiconductor rectifying device 1. FIG. 8 is a set of curves relating the reverse leakage current IR with the junction temperature Tj for the GaN-SBD, the PN-junction silicon FRD and combined semiconductor rectifying device 1. As FIGS. 7 and 8 indicate, combined semiconductor rectifying device 1 exhibits only the low IR characteristics of the simple PN-junction silicon FRD.

Working Example 2

FIG. 9 is a wave chart describing the reverse recovery current waveform and the reverse voltage waveform of a simple SiC-SBD exhibiting a rated voltage of 600 V and a rated current of 10 A. FIG. 10 is a wave chart describing the reverse recovery current waveform and the reverse voltage waveform of a simple PN-junction silicon FRD exhibiting a rated voltage of 600 V and a rated current of 10 A. FIG. 11 is a wave chart describing the reverse recovery current waveform and the reverse voltage waveform of combined semiconductor rectifying device 1 according to a working example 2 of the invention that includes the discrete diodes described in FIGS. 9 and 10 and connected in series to each other.

As FIG. 11 indicates, combined semiconductor rectifying device 1 according to the working example 2 exhibits the reverse recovery current waveform and the reverse voltage waveform of the simple SiC-SBD (cf. FIG. 9) but does not exhibit the reverse recovery current waveform nor the reverse voltage waveform of the simple PN-junction silicon FRD. The peak overshoot reverse voltage VRP caused during the reverse recovery across combined semiconductor rectifying device 1 according to the working example 2 is 422 V (cf. FIG. 11) and suppressed to be lower than the peak overshoot reverse voltage VRP of the PN-junction silicon FRD, that is 486 V (cf. FIG. 10).

FIG. 12 is a wave chart describing the waveforms of the voltages shared by the SiC-SBD and the PN-junction silicon FRD with the timings thereof adjusted to the ON and OFF of the current (6 A) and the voltage (400 V) applied to combined semiconductor rectifying device 1 according to the working example 2. As FIG. 12 indicates, the voltage of 400 V is applied to the SiC-SBD at the voltage sharing rate of 100% but not almost applied to the PN-junction silicon FRD. Since the SiC-SBD exhibits a breakdown voltage of 600 V or higher, a voltage share will be applied to the PN-junction silicon FRD, if the applied voltage exceeds the breakdown voltage of the SiC-SBD. However, since the applied voltage is 400 V in FIG. 12, the SiC-SBD sustains the applied voltage at the voltage sharing rate of 100%. If combined semiconductor rectifying device 1 according to the working example 2 is used under the condition, in which any voltage exceeding the breakdown voltage of the SiC-SBD is not applied, the breakdown voltage of the PN-junction silicon FRD may be lower than the breakdown voltage of the SiC-SBD with no problem. Therefore, it is possible to employ a PN-junction silicon FRD that exhibits a low breakdown voltage and facilitates obtaining not only low IR characteristics but also low VF characteristics.

FIG. 13 relates the peak overshoot reverse voltage VRP with the current changing rate dir/dt at the time of reverse recovery based on the reverse recovery current waveforms and the reverse voltage waveforms described in FIGS. 9 through 11. In FIG. 13, the vertical axis represents the peak overshoot reverse voltage VRP and the horizontal axis the changing rate of the reverse recovery current dir/dt. As the double-headed arrow in FIG. 13 indicates, a soft recovery performance is enhanced more on the left hand side of the drawing and a hard recovery performance is enhanced more on the right hand side of the drawing. The changing rate dir/dt of the reverse recovery current and the peak overshoot reverse voltage of combined semiconductor rectifying device 1 are as low as those of the SiC-SBD, indicating that combined semiconductor rectifying device 1 exhibits an excellent soft recovery performance.

FIG. 14 is a block circuit diagram showing a boost-type power factor correction circuit (hereinafter referred to as a "PFC circuit") that employs combined semiconductor rectifying device 1 according to the invention. The PFC circuit shown in FIG. 14 includes diode D, switch Q inductance L, and a control IC. The voltage and the current, fed from an AC line through an input rectifying section (not shown), are applied to DC terminals 11 and 12. A current and a voltage are outputted from terminals 21 and 22 at a corrected power factor. Switch Q is controlled by the control IC that feeds a pulse width modulation signal (hereinafter referred to as a "PWM signal") having a relatively high frequency (e.g. from 60 to 100 kHz). The control methods include a discontinuous current mode of control that employs a discontinuous inductance current and a continuous current mode of control that employs a continuous inductance current. The continuous current mode of control is employed mainly in the PFC circuit for outputting high electric power (about 150 W or higher). Since the continuous current mode of control makes switch Q ON while diode D is conductive in forward, the forward current of diode D is forced to be biased in reverse, causing switching loss Wrr in association with the reverse recovery phenomena of diode D. As a matter of course, a reverse voltage is applied to diode D in the ON-state of switch Q, causing a reverse power loss WR by the reverse leakage current IR of diode D. In the OFF-state of switch Q, a forward current flows through diode D, causing a forward power loss WF by the forward voltage drop VF.

FIG. 15 is a distribution chart describing the loss analysis results for diode D and switch Q in the PFC circuit of the continuous current mode. The losses caused by switch Q occupy a very large part, a little bit more than the two-third, of the total losses. The reverse recovery characteristics of diode D affect greatly the turn-ON loss that occupies about half the losses of switch Q. Therefore, for reducing the turn-ON loss of switch Q, it is necessary to shorten the reverse recovery time trr of diode D. If combined semiconductor rectifying device 1 according the working example 1 or 2 is employed for combined diode D in the PFC circuit of the continuous current mode, it will be possible to reduce not only the losses of combined diode D but also the losses of switch Q. Since the loss reduction for switch Q is effected dominantly by the shortening of the reverse recovery time trr of diode D, the loss simulation results for diode D are described in FIGS. 16 through 18.

FIG. 16 is a pair of curves relating the simulated losses of a diode simulating the PFC circuit in the 400 W power supply used for desktop PCs with the junction temperature Tj. The reverse power loss WR of a simple GaN-SBD exhibiting a rated voltage of 600 V and a rated current of 8 A increases greatly from the vicinity of the junction temperature of 125° C. Combined semiconductor rectifying device 1 according to the invention, in which the GaN-SBD exhibiting the rated values described above and a PN-junction silicon FRD exhibiting a low forward voltage drop VF, a rated voltage of 600 V and a rated current of 8 A are connected in series to each other, causes no loss increase up to the vicinity of the junction temperature of 170. The reverse power loss WR of combined semiconductor rectifying device 1 according to the invention increases greatly beyond the junction temperature of 170° C.

The loss contents of the GaN-SBD under the conditions described in FIG. 16 are described in FIG. 17. The loss contents of combined semiconductor rectifying device 1 according to the invention under the conditions described in FIG. 16 are described in FIG. 18.

In FIG. 17, the ratio of the reverse power loss becomes higher as the temperature, at which the GaN-SBD is used, becomes higher. Since the ratio of the reverse power loss of combined semiconductor rectifying device 1 is small as described in FIG. 18, the total losses of combined semiconductor rectifying device 1 are suppressed to be low. This indicates that combined semiconductor rectifying device 1 according to the invention is advantageous for use at a high temperature. In the circumstances of a high working temperature due to the future down-sizing and high-density mount of the power supply, combined semiconductor rectifying device 1 according to the invention is advantageous due to the low reverse leakage current IR thereof.

Combined semiconductor rectifying device 1 according to the invention exhibits the following effects. In combined semiconductor rectifying device 1 that includes semiconductor rectifying device 1a mounting a WBG-SBD thereon and semiconductor rectifying device 1b mounting a PN-junction silicon diode thereon, which are connected in series to each other, only semiconductor rectifying device 1a exhibiting a high breakdown voltage is biased in reverse during the reverse recovery. Therefore, combined semiconductor rectifying device 1 exhibits only the characteristics of the reverse recovery time trr of semiconductor rectifying device 1a as the characteristics of the reverse recovery time trr thereof. Combined semiconductor rectifying device 1 exhibits only the characteristics of the reverse leakage current IR of semiconductor rectifying device 1b as the characteristics of the reverse leakage current IR thereof.

Since a forward current flows through semiconductor rectifying devices 1a and 1b when a forward bias voltage is applied, combined semiconductor rectifying device 1 exhibits the sum of the characteristics of the forward voltage drop VF of semiconductor rectifying devices 1a and 1b. Therefore, it is preferable for semiconductor rectifying devices 1a and semiconductor rectifier chip 2a to cause a forward voltage drop VF as low as possible. Therefore, by employing a PN-junction silicon diode, that facilitates conducting a high-speed switching operation, causes a small reverse leakage current IR and exhibits a breakdown voltage lower that the breakdown voltage of the WBG-SBD, a combined semiconductor rectifying device that exhibits low VF characteristics is obtained. Although the invention has been described so far in connection with the structure shown in FIG. 1, the same effects are obtained by the combined semiconductor rectifying device having the structure shown in FIG. 2.

The invention has been described with reference to certain preferred embodiments thereof. Modifications and variations are possible within the scope of the appended claims.

What is claimed is:

1. A combined semiconductor rectifying device comprising:
   a PN-junction silicon diode and a Schottky barrier diode connected only in series, and not in parallel, to each other, and such that a current can flow between the PN-junction silicon diode and a Schottky barrier diode;
   wherein the Schottky barrier diode exhibits a breakdown voltage equal to or higher than a breakdown voltage of the PN-junction silicon diode;
   wherein the Schottky barrier diode comprises a semiconductor comprising a band gap wider than a band gap of silicon; and
   wherein no other diodes are included in the rectifying device.

2. The combined semiconductor rectifying device according to claim 1, wherein the semiconductor comprises a silicon carbide semiconductor or a gallium nitride semiconductor.

3. The combined semiconductor rectifying device circuit according to claim 2, wherein the PN-junction silicon diode and the Schottky barrier diode are connected in series to each other in chip states thereof and sealed with a resin in a package.

4. The combined semiconductor rectifying device circuit according to claim 1, wherein the PN-junction silicon diode and the Schottky barrier diode are connected in series to each other in chip states thereof and sealed with a resin in a package.

5. An electric power converter comprising:
   a circuit comprising a switching semiconductor device and an inductor;
   wherein the circuit exhibits a power factor correction function; and
   wherein the circuit further comprises a combined semiconductor rectifying device including a PN-junction silicon diode and a Schottky barrier diode connected only in series, and not in parallel, to each other, and such that a current can flow between the PN-junction silicon diode and a Schottky barrier diode, wherein the Schottky barrier diode exhibits a breakdown voltage equal to or higher than a breakdown voltage of the PN-junction silicon diode, wherein the Schottky barrier diode comprises a semiconductor comprising a band gap wider than a band gap of silicon, and wherein no other diodes are included in the rectifying device.

6. The electric power converter as claimed in claim 5, wherein the Schottky barrier diode comprises a silicon carbide semiconductor or a gallium nitride semiconductor.

7. The electric power converter as claimed in claim 6, wherein, the PN-junction silicon diode and the Schottky barrier diode are connected in series to each other in chip states thereof and sealed with a resin in a package.

8. The electric power converter as claimed in claim 5, wherein the PN-junction silicon diode and the Schottky barrier diode are connected in series to each other in chip states thereof and sealed with a resin in a package.

* * * * *